United States Patent
Kwon et al.

(10) Patent No.: US 7,696,048 B2
(45) Date of Patent: Apr. 13, 2010

(54) METHOD OF IMPROVING GATE RESISTANCE IN A MEMORY ARRAY

(75) Inventors: Hyung-Shin Kwon, Gyeonggi-do (KR); Seug-Gyu Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 530 days.

(21) Appl. No.: 11/425,065

(22) Filed: Jun. 19, 2006

(65) Prior Publication Data

US 2007/0037336 A1      Feb. 15, 2007

(30) Foreign Application Priority Data

Aug. 12, 2005   (KR) ...................... 10-2005-0074471

(51) Int. Cl.
*H01L 21/8232* (2006.01)
*H01L 21/8239* (2006.01)
(52) U.S. Cl. ................ 438/279; 438/303; 257/E21.691
(58) Field of Classification Search ................. 438/149, 438/151, 154, 167, 169, 172, 186, 188, 191, 438/197, 199, 211, 218–219, 257, 279, 213, 438/231, 303; 257/E21.66, E21.678, E21.683, 257/E21.691, 225, 260–261, 296, 300, 314, 257/326, 390, 900, 903, 910, E27.075–E27.078, 257/E27.084–E27.085, E27.097–E27.098, 257/E27.102, E27.104, E29.17, E29.309, 257/E21.626, E21.64, E29.33, E21.209, E21.526, 257/E21.613, E21.645–E21.646, E21.661–E21.663, 257/E21.665, E21.679, E21.68
See application file for complete search history.

(56) References Cited

U.S. PATENT DOCUMENTS 4,818,714 A * 4/1989 Haskell ...................... 438/231

(Continued)

FOREIGN PATENT DOCUMENTS

DE   10 2005 020 133.4   * 4/2005   ................. 438/184

(Continued)

OTHER PUBLICATIONS

English language abstract of Korean Publication No. 2004-0005381.

(Continued)

*Primary Examiner*—W. David Coleman
*Assistant Examiner*—Maliheh Malek
(74) *Attorney, Agent, or Firm*—Volentine & Whitt, PLLC

(57) ABSTRACT

A semiconductor device is formed with a normal, non-recessed, spacer structure in a cell region and a recessed spacer structure in a peripheral region. The recessed spacer structure is formed as by etch masking those in the cell region and exposing those in the peripheral region, then performing an etch process. The increased height of the cell region spacers is adapted to further prevent over-etching during gate interconnect formation which would otherwise result in etching through the spacer to the substrate and subsequent short circuit. Therefore, it is also possible to prevent bridge defects due to over-etching, which occurs because the barrier metal layer for a subsequent interconnection contact is accidentally connected to the underlying substrate. Also, since the recessed spacer structure is provided in the peripheral region, it is possible to remarkably enhance a resistance distribution of a cobalt silicide layer occurring in a gate line width of 100 nm or less.

12 Claims, 12 Drawing Sheets

U.S. PATENT DOCUMENTS

| | | | | |
|---|---|---|---|---|
| 5,907,779 | A * | 5/1999 | Choi | 438/279 |
| 6,136,636 | A * | 10/2000 | Wu | 438/231 |
| 6,162,675 | A * | 12/2000 | Hwang et al. | 438/241 |
| 6,165,826 | A * | 12/2000 | Chau et al. | 438/231 |
| 6,194,297 | B1 * | 2/2001 | Cheng | 438/592 |
| 6,277,683 | B1 * | 8/2001 | Pradeep et al. | 438/200 |
| 6,459,121 | B1 * | 10/2002 | Sakamoto et al. | 257/315 |
| 6,512,266 | B1 * | 1/2003 | Deshpande et al. | 257/333 |
| 6,531,350 | B2 * | 3/2003 | Satoh et al. | 438/197 |
| 6,624,019 | B2 * | 9/2003 | Kim | 438/241 |
| 6,727,135 | B2 * | 4/2004 | Lee et al. | 438/230 |
| 6,770,540 | B2 * | 8/2004 | Ko | 438/303 |
| 6,780,701 | B2 * | 8/2004 | Kanda et al. | 438/218 |
| 6,916,718 | B2 * | 7/2005 | Chen et al. | 438/303 |
| 7,217,985 | B2 * | 5/2007 | Kim | 257/500 |
| 7,229,870 | B2 * | 6/2007 | Lee | 438/199 |
| 7,262,103 | B2 * | 8/2007 | Lee et al. | 438/279 |
| 7,354,838 | B2 * | 4/2008 | Kammler et al. | 438/303 |
| 7,446,007 | B2 * | 11/2008 | Adkisson et al. | 438/303 |
| 7,470,562 | B2 * | 12/2008 | Kim et al. | 438/104 |
| 2002/0192868 | A1 * | 12/2002 | Kim | 438/112 |
| 2003/0011017 | A1 * | 1/2003 | Lee et al. | 257/314 |
| 2003/0025163 | A1 * | 2/2003 | Kwon | 257/360 |
| 2003/0027414 | A1 * | 2/2003 | Ko | 438/595 |
| 2004/0072435 | A1 * | 4/2004 | Quek | 438/691 |
| 2004/0155269 | A1 * | 8/2004 | Yelehanka et al. | 257/288 |
| 2004/0166630 | A1 * | 8/2004 | Ogura et al. | 438/257 |
| 2005/0048753 | A1 * | 3/2005 | Schwan | 438/595 |
| 2005/0082605 | A1 * | 4/2005 | Akasaka | 257/329 |
| 2005/0112817 | A1 * | 5/2005 | Cheng et al. | 438/219 |
| 2005/0266639 | A1 * | 12/2005 | Frohberg et al. | 438/257 |
| 2006/0148145 | A1 * | 7/2006 | Yun | 438/184 |
| 2006/0246641 | A1 * | 11/2006 | Kammler et al. | 438/184 |
| 2007/0249177 | A1 * | 10/2007 | Koemtzopoulos et al. | 438/733 |
| 2007/0259491 | A1 * | 11/2007 | Nakagawa | 438/218 |

FOREIGN PATENT DOCUMENTS

| | | |
|---|---|---|
| JP | 2000-150681 | 5/2000 |
| JP | 2003-017583 | 1/2003 |
| KR | 2004-0005381 | 1/2004 |

OTHER PUBLICATIONS

English language abstract of Japanese Publication No. 2000-150681.
English language abstract of Japanese Publication No. 2003-017583.

* cited by examiner

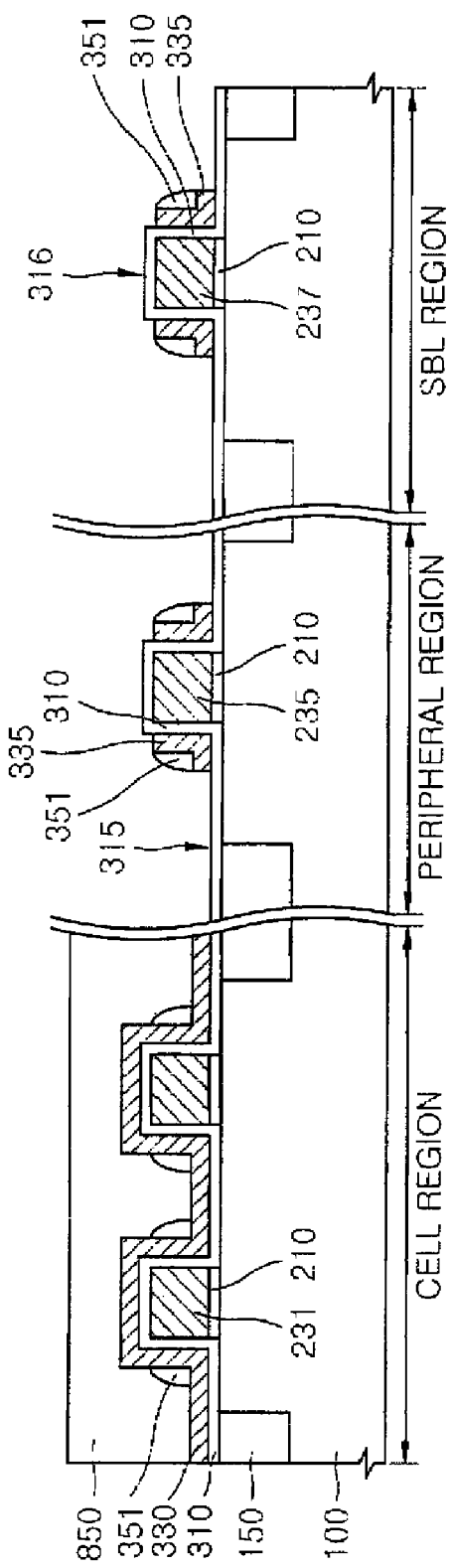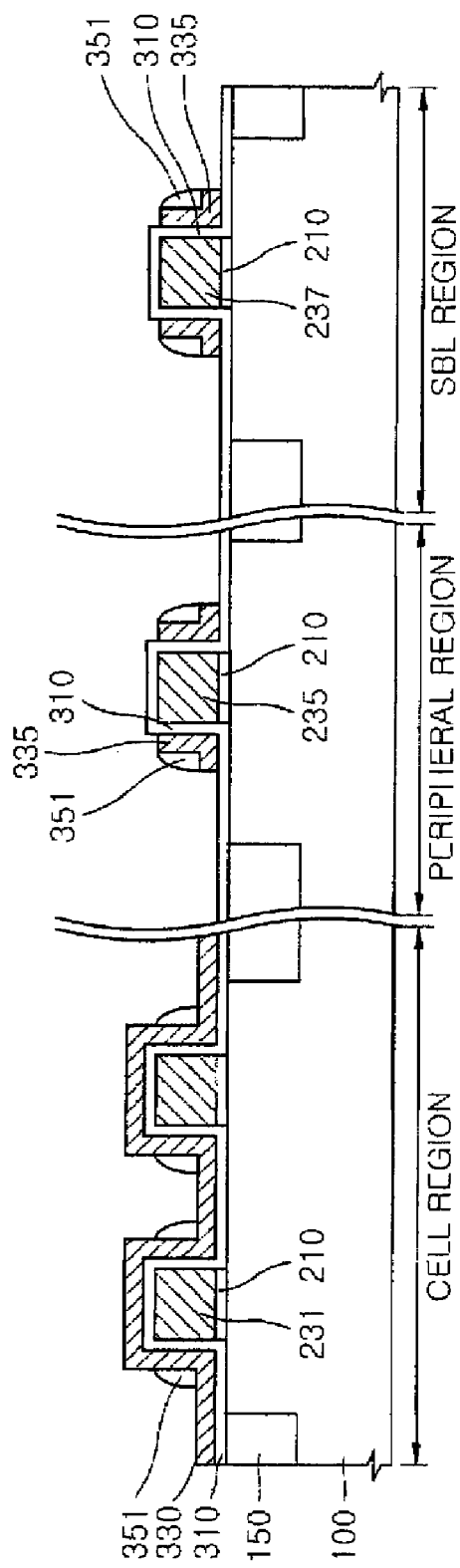

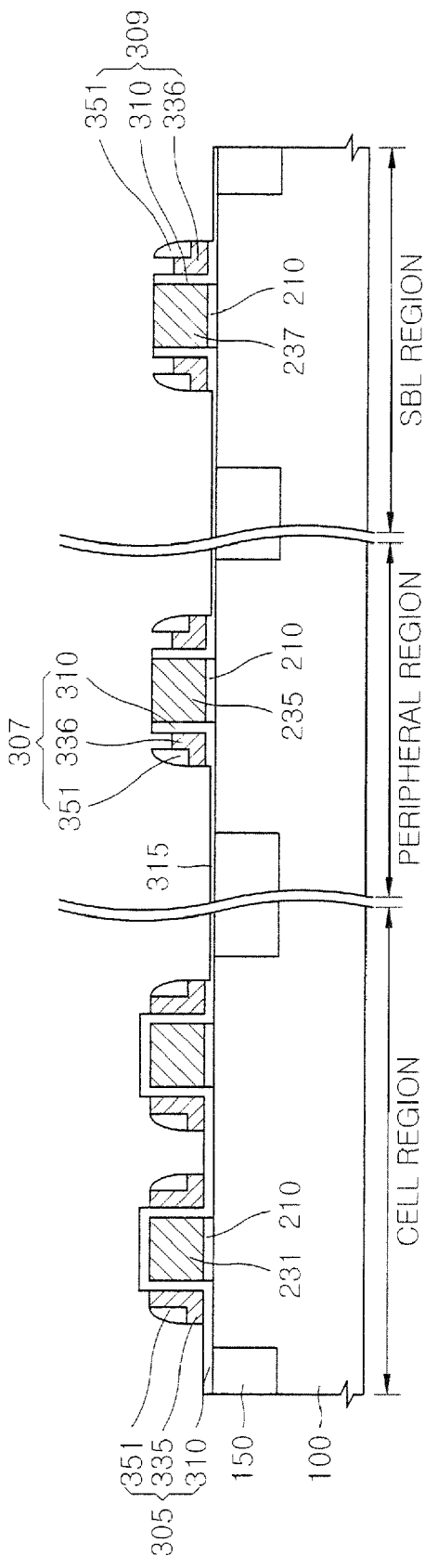
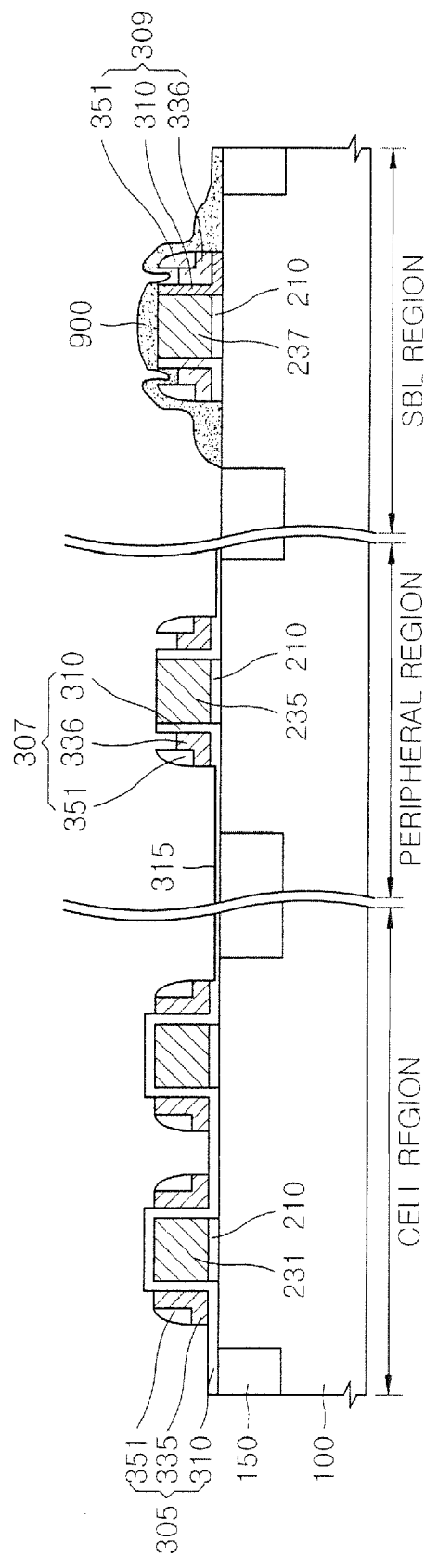

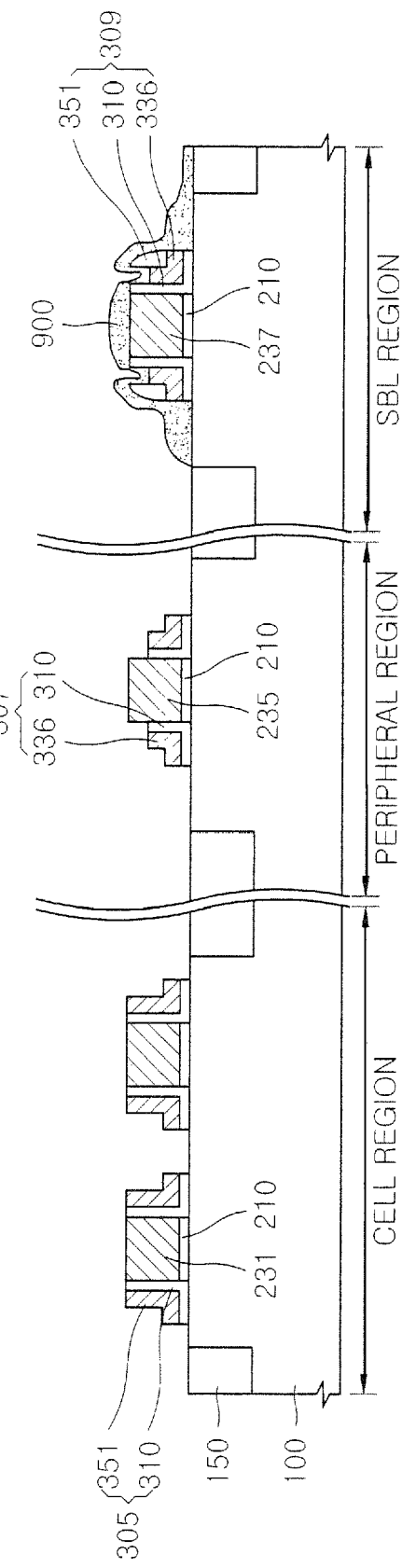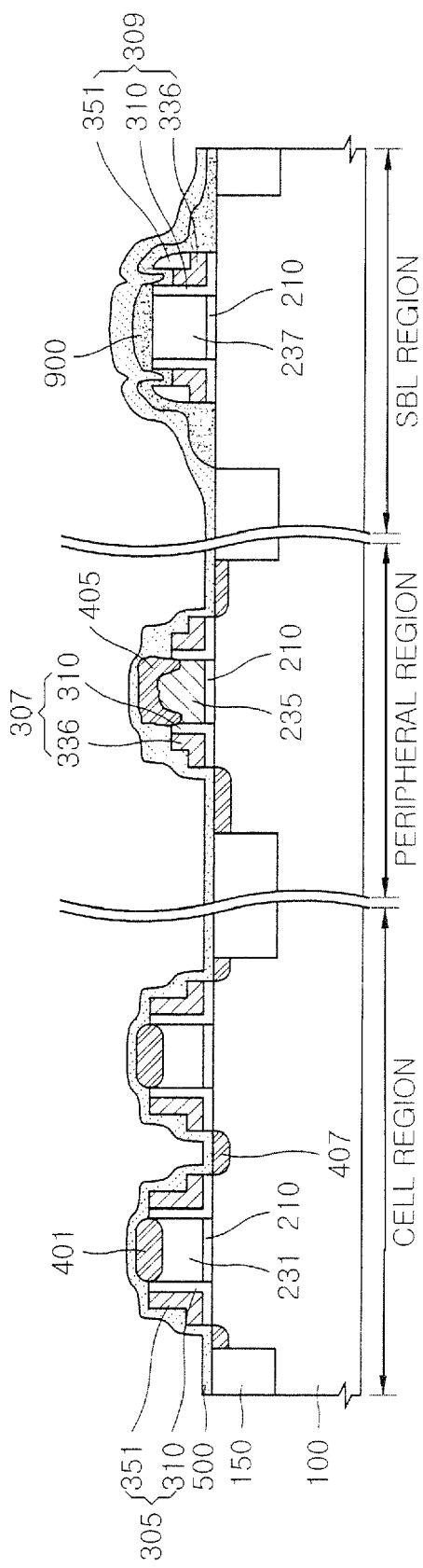

METHOD OF IMPROVING GATE RESISTANCE IN A MEMORY ARRAY

CROSS-REFERENCE TO RELATED PATENT APPLICATION

This application claims the benefit of Korean Patent Application No. 10-2005-74471, filed on Aug. 12, 2005, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a semiconductor device with an improved gate resistance and a method of its manufacture.

2. Description of the Related Art

Gate lengths of semiconductor devices may be scaled down to, say, 100 nm or less to produce highly integrated semiconductor device. Along with this reduction in gate lengths has been a lot of effort to improve the gate resistance. One method is to incorporate conductive polysilicon layers in the gates and form cobalt silicide ($CoSi_2$) layers over the gates.

However, in forming a cobalt silicide layer having low resistance, it is important to provide a large contact area between the cobalt layer and the silicon layer of the gate. To this end, a method of recessing gate spacers on sidewalls of the gate to increase an open area of the gate has been proposed.

In this case, when forming local interconnection lines or interconnection contacts that are aligned over the cobalt silicide layer, bridge defects may occur where a local interconnection or an interconnection contact is accidentally electrically connected to a channel of an underlying silicon substrate.

FIGS. 1 through 5 are schematic cross-sectional views illustrating a method of improving the gate resistance of a conventional semiconductor device.

Referring to FIG. 1, according to a method of manufacturing the conventional semiconductor device, an isolation region 15 is formed in a semiconductor substrate 10, and a gate dielectric layer 21 and a gate 23 are formed on the semiconductor substrate 10. A spacer formed of a silicon oxide layer 31 and a silicon nitride layer 33 is then formed on a sidewall of the gate 23, and the spacer is recessed relative to the gate 23 height in both the cell and peripheral regions of the circuit.

Referring to FIG. 2, a cobalt silicide layer 40 is formed on the surface of the gate 23, and an etch stop layer 50 is formed on the cobalt silicide layer 40, spacer layers 31 and 33, exposed substrate 10, and isolation region 15.

Referring to FIG. 3, an insulating layer 60 is formed on the etch stop layer 50, and through holes 61 and 63 are formed in the insulating layer 60 in the cell region and peripheral region respectively. The first through holes 61 of a cell region are aligned over at least a portion of the cobalt silicide layer 40 for an interconnection contact and a local interconnection. The second through hole 63 of a peripheral region is aligned over the semiconductor substrate 10 for connecting a metal interconnection.

Because of the interposition of the gate structure in the cell region and raised etch stop layer 50 atop it, the depth of the first through holes 61 is generally different from the depth of the second through hole 63. Though a portion 51 of the etch stop layer 50 under the first through hole 61 is exposed, the second through hole 63 may not be open to the etch stop layer 50 so that an insulating portion 65 of layer 60 remains thereunder. While the insulating portion 65 is removed by subsequent etching, the portion 51 of the etch stop layer 50 under the first through hole 61 normally prevents underlying layers from being etched further. However, the portion 51 of the etch stop layer 50 may disappear in some cases during the etch process used to complete the hole 63 down through to the substrate 10.

Referring to FIG. 4, since the spacer is recessed and its height is reduced, the silicon oxide layer 31 of the spacer may be exposed and disappear as the etch process progresses. Furthermore, after completing the etch process for removing the insulating layer 60 for the first and second through holes 61 and 63, a large amount of the silicon oxide layer 31 may disappear during an etch process for removing the exposed etch stop layer 50.

Therefore, most portions of the exposed silicon oxide layer 31 disappear during the etch process for removing the insulating layer 60 and/or the removal of the etch stop layer 50, so that defects may easily occur when a portion of the semiconductor substrate 10 under the silicon oxide layer 31, i.e., a surface of a transistor channel or a junction, is exposed. That is, an undesirable bridge hole 66 may expose the surface of the semiconductor substrate 10 under the first through holes 61.

Referring to FIG. 5, if the hole 66 is undesirably formed, a short between first contact 71 and second contract 73 may form. That is, the first and second through holes 61 and 63 are filled with tungsten or other conductor to form a first contact 71 and a second contact 73. At this time, the first contact 71, which may be the interconnection contact or the local interconnection in the cell region, is extended to the bridge hole 66 so that a bridge 72 may be formed to fill the bridge hole 66. Due to the bridge 72, defects may occur where the first contact 71 and the semiconductor substrate 10 may be accidentally shorted together.

Since the first through hole 61 aligned over the gate 23 is needed in the cell region, it is understood that the bridge 72 is caused by a recess structure of the spacer. Accordingly, there is a great need for developing a method of preventing the bridge 72 in the cell region as well as improving the gate resistance of the semiconductor transistor.

SUMMARY

Embodiments provide a semiconductor device capable of preventing a bridge defect between a local interconnection or an interconnection contact aligned over a gate and an underlying substrate in a cell region, as well as improving a gate resistance, and a method of manufacturing the same.

According to an embodiment, a method of manufacturing a semiconductor device includes: forming a first gate and a second gate over a first region and a second region of a semiconductor substrate, respectively; sequentially forming a first layer formed of a first insulating material covering the first gate and the second gate, a second layer formed of a second insulating material, and a third layer formed of a third insulating material; forming a spacer first pattern of the third layer by anisotropically etching the third layer using the second layer as an etch stop point; forming a spacer second pattern of the second layer on a side portion of the second gate by selectively exposing and anisotropically etching a portion of the second layer over the second region; forming a spacer third pattern of the second layer over the first region by etching a portion of the second layer, and forming a recessed spacer second pattern by recessing the spacer second pattern;

forming a first spacer and a second spacer by selectively etching the spacer first pattern and an exposed portion of the first layer, wherein the first spacer includes a portion of the first layer and the spacer third pattern similar in height to the first gate, and the second spacer includes a portion of the first layer recessed to expose a side surface of an upper portion of the second gate and the recessed spacer second pattern, the second spacer being lower than the first spacer; forming a first silicide layer on an exposed upper surface of the first gate, and a second silicide layer on an exposed upper surface and side surface of the second gate; forming an insulating layer covering the first and the second silicide layers; forming a first through hole penetrating the first insulating layer to be aligned over the first gate, and a second through hole opening a surface of the semiconductor substrate near to the second gate; and forming a first interconnection structure filling the first through hole and a second interconnection structure filling the second through hole.

According to another embodiment, a method of manufacturing a semiconductor device includes: forming a plurality of first gates over a first region of a semiconductor substrate and a second gate over a second region of the semiconductor substrate; forming an L-shaped first spacer on a sidewall of the first gate and an L-shaped second spacer on a sidewall of the second gate, a height of the L-shaped first spacer being equal to that of the first gate, a height of the L shaped second spacer being lower than that of the L shaped first spacer; forming a first silicide layer on a surface of the first gate, and a second silicide layer on a surface of the second gate, each surface of the first and the second gates being exposed by the spacers; forming an insulating layer covering the first and second silicide layer; forming a first through hole penetrating through the insulating layer, and a second through hole opening a surface of the second substrate near to the second gate, the first through hole being aligned over the first gate for connecting the adjacent first gates in an upper layer; and forming a first contact filling the first through hole and a second contact filling the second through hole.

According to still another embodiment, a method of manufacturing a semiconductor device includes: forming a plurality of first gates over a first region of a semiconductor substrate and a second gate over a second region of the semiconductor substrate; forming a first spacer on a sidewall of the first gate and a second spacer on a sidewall of the second gate, a height of the first spacer being equal to that of the first gate, a height of the second spacer being lower than that of the first spacer; forming a first silicide layer on a surface of the first gate, and a second silicide layer on a surface of the second gate, each surface of the first and the second gates being exposed by the spacers; forming an insulating layer covering the first and second silicide layer; forming a first through hole penetrating the insulating layer to be aligned over the first gate, and a second through hole opening a surface of the second substrate near to the second gate; and forming a first contact filling the first through hole and a second contact filling the second through hole.

According to yet another embodiment, a semiconductor device includes: a first gate disposed over a first region and a second gate disposed over a second region of a semiconductor substrate; a first spacer formed on a sidewall of the first gate, a height of the first spacer being equal to that of the first gate; a second spacer formed on a sidewall of the second gate, a height of the second spacer being lower than that of the first spacer to expose a sidewall of an upper portion of the second gate; a first silicide layer disposed over the first gate; a second silicide layer formed over the second gate, the second silicide layer being thicker than the first silicide layer; an insulating layer covering the first and the second silicide layers; a first through hole penetrating the insulating layer to be aligned over the first gate and a second through hole opening a surface of the semiconductor substrate near to the second gate; and a first contact filling the first through hole and a second contact filling the second through hole.

The semiconductor device may further include: forming a third gate over a third region of the semiconductor substrate together with the first gate; forming a third spacer on sidewalls of the third gate, the third spacer including a spacer fourth pattern formed together with the spacer first pattern, a recessed spacer fifth pattern formed together with the recessed spacer second pattern, and a portion of the first layer remaining on the sidewall of the third gate of which an upper surface is exposed at the same time as the upper surface of the second gate is exposed; and forming an SBL (silicide blocking layer) covering the third region before forming the silicide layer to protect an underlying structure from a silicidation reaction.

The semiconductor device may further include: a third gate formed over a third region of the semiconductor substrate; an SBL directly covering the third gate and the semiconductor substrate disposed near to the third gate; and a third spacer including a spacer fifth pattern having the same shape as the spacer first pattern, a spacer sixth pattern having the same shape with the space fourth pattern, and a spacer seventh pattern aligned over the spacer fifth pattern formed of an insulating material different from that of the spacer fifth pattern.

BRIEF DESCRIPTION

The above and other features and advantages of the present invention will become more apparent by describing in detail exemplary embodiments thereof with reference to the attached drawings in which.

FIGS. 8 through 14 are schematic cross-sectional views illustrating a semiconductor device with improved gate resistance and a method of manufacturing the same according to an embodiment of the present invention; and FIGS. 15 through 23 are cross-sectional views illustrating a semiconductor device with improved gate resistance and a method of manufacturing the same according to another embodiment of the present invention.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Some embodiments provide a method of reducing gate resistance by disposing a silicide layer such as a cobalt silicide layer on a gate containing polysilicon in a semiconductor substrate.

Various devices having different operations can be implemented on separate regions of the semiconductor substrate. A recessed spacer structure is selectively applied so that a region (e.g., a peripheral region) for high-speed devices may be thickly formed. For example, a region for a cobalt silicide layer may be thickly formed.

A device such as an SRAM device requiring an interconnection contact or a local interconnection aligned over a gate may be formed in a cell region. Therefore, a spacer entirely covering sidewalls of the gate may be used instead of a recessed spacer in the cell region.

According to the embodiments, the spacers are formed in different structures in the regions of the semiconductor substrate. Thus, it is possible to prevent a gate interconnection contact or local interconnection from being accidentally shorted to the semiconductor substrate or a bridge defect, which may occur as the height of the spacer is decreased.

According to some embodiments, an L-shaped spacer can be introduced, which can make it possible to implement a device having an electrostatic discharge (ESD) region between a channel and drain/source regions. At this time, a device such as an ESD protection transistor having a silicide blocking layer (SBL) may be provided in an SBL region and therefore a cobalt silicide layer cannot be formed.

Some embodiments illustrate an SRAM device formed in the cell region and a high-speed device requiring a greatly reduced gate resistance in the peripheral region.

Figure 6:
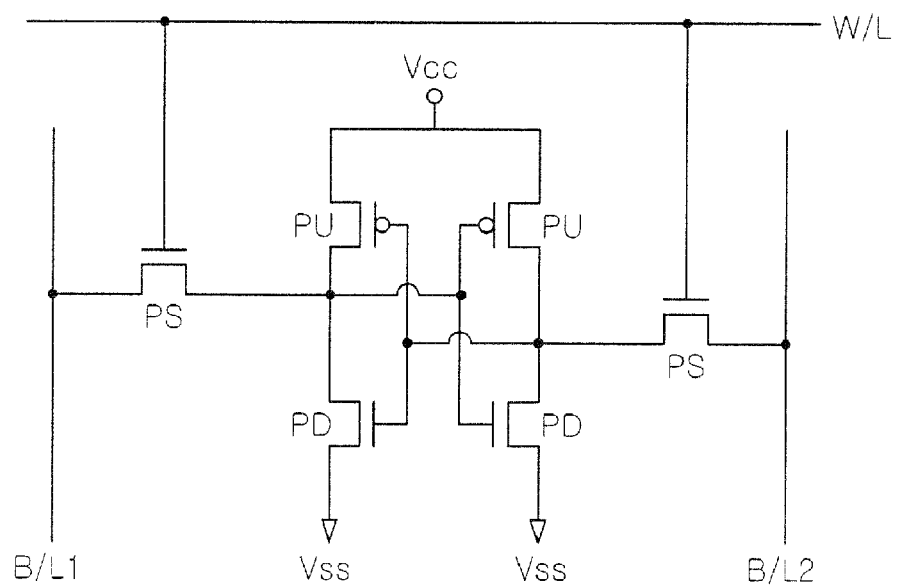
FIG. 6 is a schematic circuit diagram of a static random access memory (SRAM) device for explaining a semiconductor device with improved gate resistance according to an embodiment of the present invention.
Figure 7:
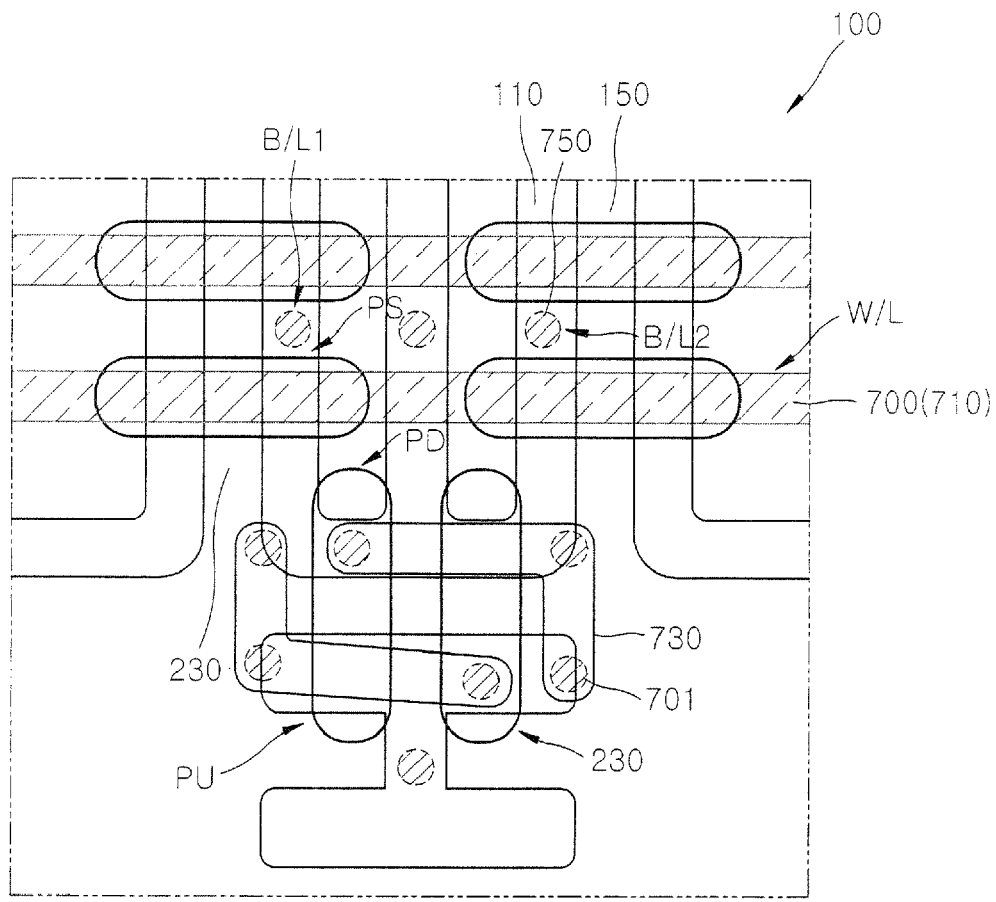
FIG. 7 is a schematic layout of the SRAM device of FIG. 6 for explaining the semiconductor device with improved gate resistance according to an embodiment of the present invention.

FIG. 6 is a schematic circuit diagram of an SRAM device for explaining a semiconductor device having enhanced gate resistance according to an embodiment. FIG. 7 is a schematic layout of the SRAM device for explaining the semiconductor device having enhanced gate resistance according to the current embodiment.

Referring to FIG. 6, PMOS transistors and NMOS transistors constitute a flip-flop circuit in the SRAM device.

Two pull-down transistors PD and two pull-up transistors PU are collected together to form the flip-flop. The SRAM device is configured with the transistors PD and PU and two pass transistors PS. Bit lines B/L1 and B/L2 are connected to the flip-flop circuit, and a word line W/L is connected to the pass transistors PS.

Referring to FIG. 7, the SRAM device may include a gate 230 formed in an active area 110 which is defined by isolation regions 150 with a shallow trench isolation (STI) structure.

The gates 230 of the pass transistors PS are commonly connected to the word line W/L. To this end, a local interconnection structure 700 connecting the gates 230 of the neighboring pass transistors PS together is formed in a shape of a contact exposing the gates 230 and filling through holes. The local interconnection structure 700 can be elongated and used as the word line W/L. For this purpose, the through hole for the local interconnection structure 700 extends over an insulating layer in a line shape so that the gate 230 is exposed.

Another second local interconnection structure 730 may be provided to connect the pull-up transistors PU and the pull-down transistors PD constituting the flip-flop circuit. The second local interconnection structure 730 may connect the gates 230 to a source/drain region of another transistor. Accordingly, the through holes are formed to different depths at contact points 701. The through holes that can be considered as being connected together are formed in the insulating layer. Also, an interconnection contact 750 formed in a through hole exposing the substrate 100 may also be provided to connect to the bit line B/L, and so on.

In this manner, in implementing the SRAM device in the cell region, the through holes for the local interconnection structure 700/730 or the interconnection contact 701 are aligned to expose the surface of the gate 230, or directly expose the surface of the semiconductor substrate 100. Thus, although through holes are formed in the same process, the process of forming the through holes having different depths may be performed.

As described above with reference to FIGS. 4 and 5, the process of forming the through holes may cause an unwanted loss of the oxide material during forming the cobalt silicide layer on the gate 230, thereby causing bridge defects.

To overcome this problem, a normal spacer structure is provided at sidewalls of the gate 230 in the cell region where the SRAM device is constructed, and a recessed spacer structure having a reduced height is provided in the peripheral region or the SBL region. Consequently, a relatively high spacer is formed in the gate 230 of the cell region. Since the spacer is high and thick enough to be maintained during the process of forming the through hole, it is possible to prevent the surface of the semiconductor substrate 100 from being exposed. Therefore, it is possible to prevent poor gate resistance or expansion of defective dispersion in the cell region.

In addition, since the recessed spacer structure is provided in the peripheral region or the SBL region, the surface area of the gate 230 exposed during the silicide process can be expanded. Therefore, the contact area and thickness of the cobalt silicide layer can be increased. Consequently, the gate resistance may greatly decrease so that the high-speed device formed in the peripheral region can have relatively low gate resistance.

FIGS. 8 through 14 are schematic cross-sectional views illustrating a semiconductor device with improved gate resistance and a method of manufacturing the same according to some embodiments.

Figure 8:
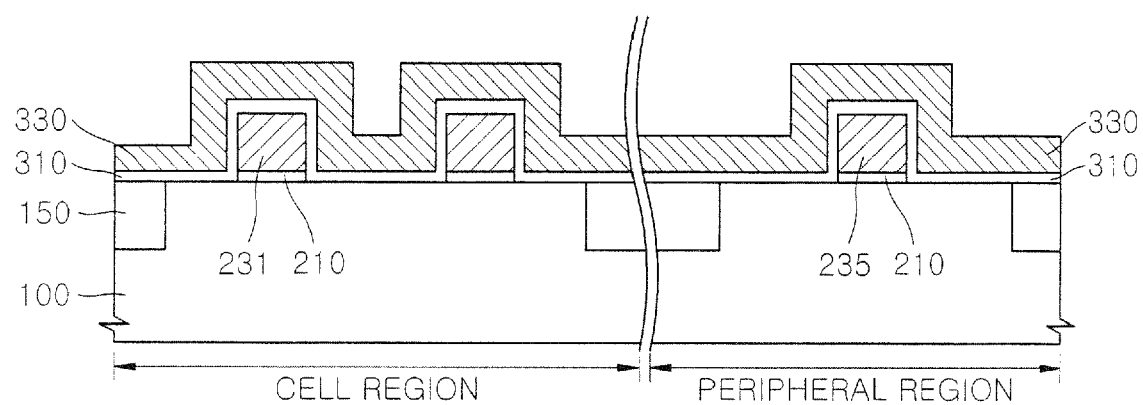

Referring to FIG. 8, gates 231 and 235, each with a gate dielectric layer 210, are formed over a semiconductor substrate 100 having a cell region and a peripheral region. An active region is defined by isolation regions 150. The gate dielectric layer 210 may be formed of silicon oxide.

The gates 231 and 235 may include a conductive polysilicon layer, and may be patterned to have a line width of about 100 nm or less. An upper surface of the gates 231 and 235 may have a line width of about 80 nm and may be formed to have a thickness of about 2,000 Å. According to the scaling-down of the device, the gates 231 and 235 may be formed a thickness of about 1,500 Å, for example.

After forming the gates 231 and 235, a lightly doped drain (LDD) region (not shown) can be formed by implanting impurity ions into a portion of the semiconductor substrate 100 adjacent to the gates 231 and 235.

Thereafter, a spacer process is performed for forming the spacers on sidewalls of the gates 231 and 235. For example, insulating layers having different etching selectivities may be formed in sequence and are anisotropically etched to form the spacers. To this end, a first layer 310 (e.g., a silicon oxide layer) and a second layer 330 (e.g., a silicon nitride layer) are sequentially formed to cover the gates 231 and 235. The first layer 310 may be formed by depositing a middle temperature oxide (MTO) to a thickness of about 100 Å to 200 Å, and the second layer 330 may be formed relatively thickly, for example, to a thickness of about 400 Å.

Figure 9:
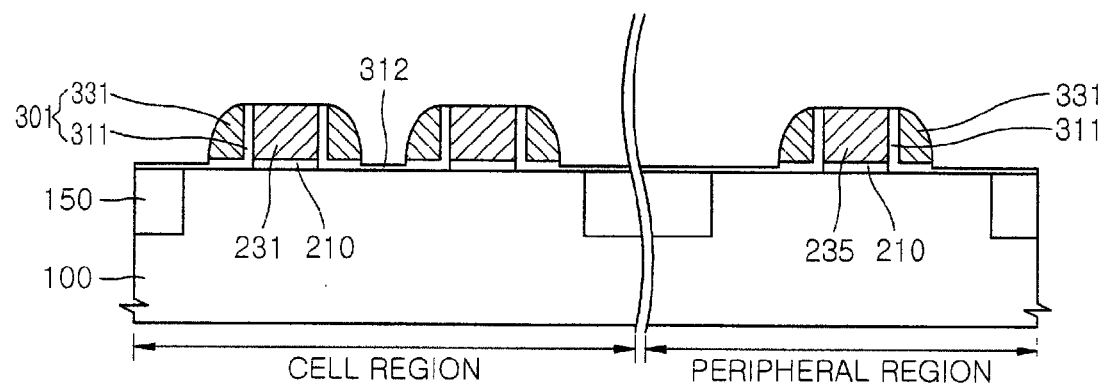

Referring to FIG. 9, spacers 311 and 331 are formed by performing a spacer first etch (i.e., an anisotropic etch) on the second layer 330 and the first layer 310. The spacers 311 and 331 are normal spacers covering the sidewalls of the gates 231 and 235. These normal spacers will be referred to as first spacers 301. The first layer 310 may be formed in a liner shape and act as a buffer layer.

The first spacers 301 are formed so that a predetermined thickness of the first layer 310 is exposed outside the first spacers 301 while extending on the semiconductor substrate 100. In other words, a portion of the first layer 310 not covered by the spacer 331 after the first spacer etch may remain on the semiconductor substrate 100. For instance, an etch time is controlled so that a residual portion 312 of the first layer 310 remains at a thickness of about 50 Å to 100 Å. That is, in etching the spacers, an over etch time is decreased so that the residual portion 312 of the first layer 310 remains at a predetermined thickness. The residual portion 312 of the first layer 310 can be used to prevent the semiconductor substrate 100 from being etched during following etch processes.

The portion of the second layer 330 covering the upper surface of the gates 231 and 235 may be entirely removed to expose the upper surface of the gates.

Although not illustrated, an ion implantation process may be performed to form source/drain regions in the exposed semiconductor substrate 100 using the first spacers 311 and 331 as a mask.

Figure 10:
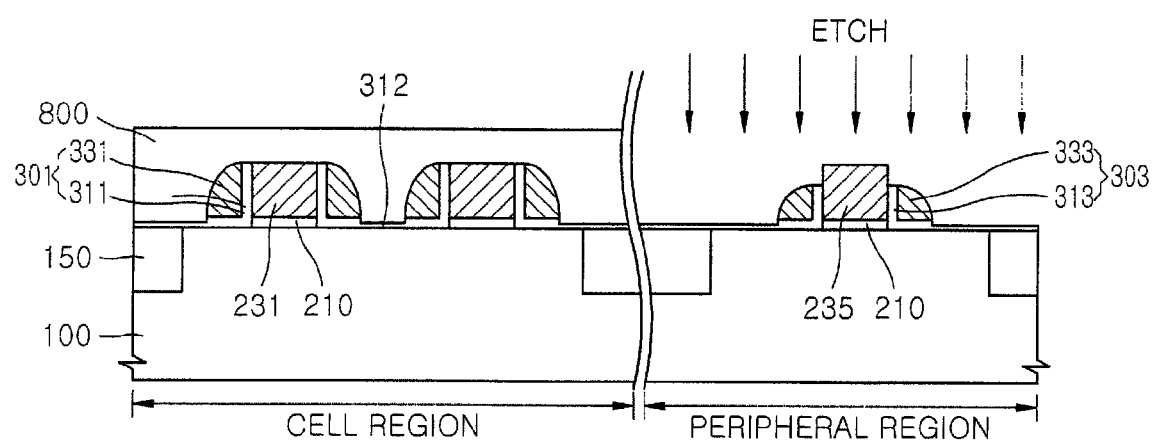

Referring to FIG. 10, an etch mask 800 may be formed to cover the cell region while exposing the peripheral region. The cell region is a region in which first through holes aligned over the first gates 231 are formed, and the peripheral region is a region in which second through holes aligned over the substrate 100 are formed. The etch mask 800 may include a photoresist pattern formed by photolithography.

Then, a spacer second etch process is selectively performed on the peripheral region exposed by the etch mask 800. Consequently, the spacers in the exposed peripheral region flanking peripheral gate 235 are etched so that their heights are reduced. Accordingly, the first spacer 301 having a normal height remains at the sidewalls of the first gate 231 in the cell region. The spacers 313 and 333, which will collectively be referred to as second spacers 303, having a relatively reduced height remain at the sidewalls of the second gate 235 in the peripheral region.

The second spacers 303 are relatively lower in height than the first spacers 301, for example by about 100 Å to 500 Å. Consequently, an upper portion of the sidewall of the second gate 235 is exposed and thus the exposed surface area of the second gate 235 is larger than the first gate 231. The residual portion 312 of the first layer can be lowered further in the exposed peripheral region.

Figure 11:
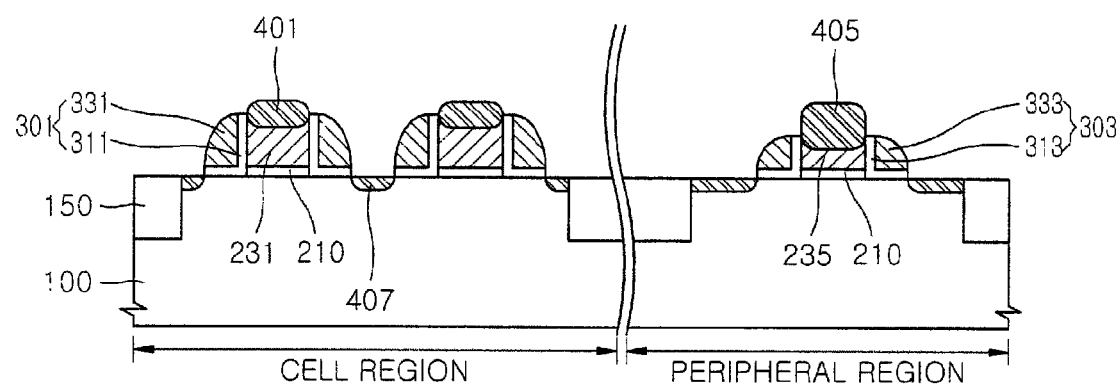

Referring to FIG. 11, the etch mask 800 is selectively removed, and a first silicide layer 401 and a second silicide layer 405 may be formed on the first gate 231 and the second gate 235, respectively.

The resulting structure in which the etch mask 800 is removed may be cleaned to remove any oxide material. At this time, the residual portion 312 of the first layer 310 may be removed. Afterward, a metal layer, such as a cobalt layer, may be deposited on the cleaned resulting structure (not shown), and a silicidation process may be performed by a first heat treatment process at about 400° C. Because some of the sidewall of the gate 235 is exposed to the cobalt layer deposition, the resulting silicide formation is thicker than for gate 231 where only the top surface is exposed. This is referred to herein as an increased contact surface area. A portion of the cobalt layer that does not participate in the silicidation reaction may be selectively removed by a chemical wet strip, etc.

Consequently, the first and second silicide layers 401 and 405 of the cobalt silicide are formed on the surfaces of the first and second gates 231 and 235, respectively. Also, a third silicide layer 407 may be formed on the surface of the exposed semiconductor substrate 100, which may be used for source/drain electrodes. At this time, the second silicide layer 405 has a greater contact surface area and is relatively thicker than the first silicide layer 401, and is formed on the second gate 235.

The silicidation reaction depends on the contact surface between the silicon and the metal. Accordingly, the second silicide layer 405 may be formed about 50 Å thicker than the first silicide layer 401, e.g. to about 300 Å.

A second heat treatment process may then be performed at about 800° C. to reduce the resistance of the cobalt silicide layer. This heat treatment may be performed using a rapid temperature system (RTS).

Figure 12:
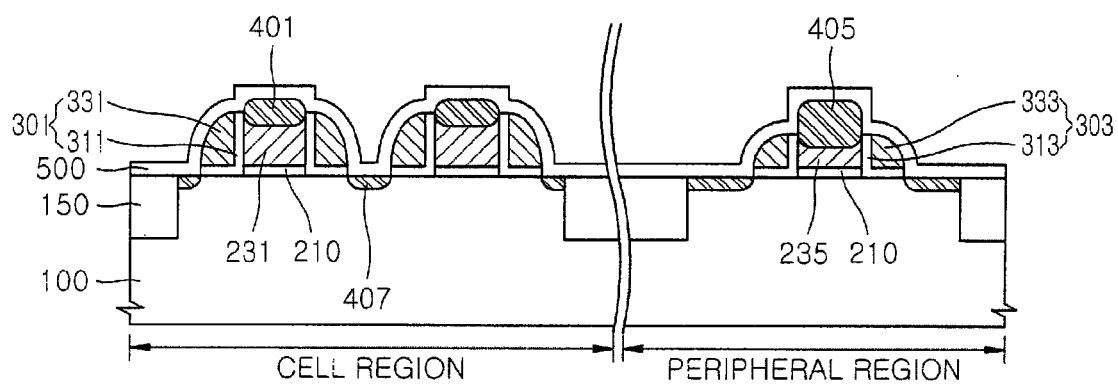

Referring to FIG. 12, an etch stop layer 500 covering the first, second and third silicide layers 401, 405, and 407 may be formed. The etch stop layer 500 may include a silicon oxynitride (SiON) layer tens of angstroms thick, for example 60 Å thick.

Figure 13:
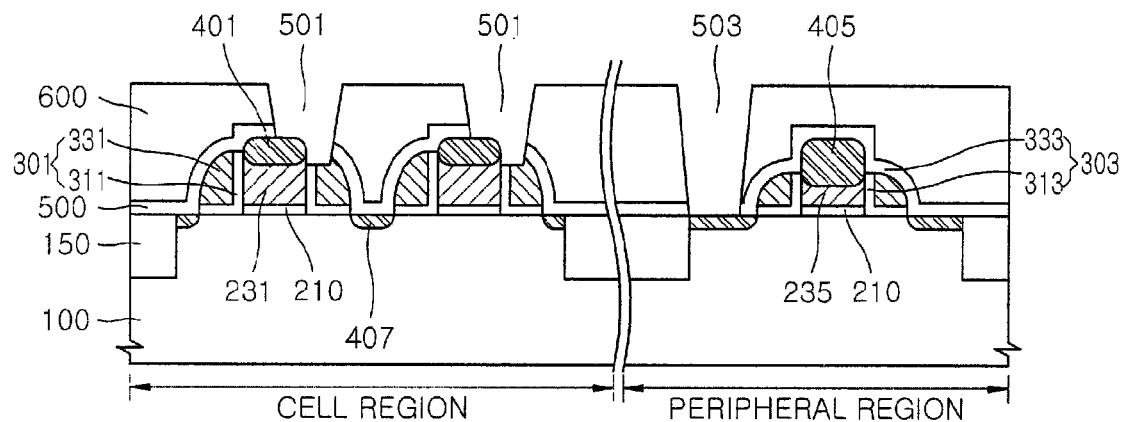

Referring to FIG. 13, an insulating layer 600 such as a silicon oxide layer may be formed on the etch stop layer 500. Then, the insulating layer 600 may be selectively etched using a photolithography and etching process to form first and second through holes 501 and 503 in the insulating layer 600.

The first through hole 501 may be aligned over the first gate 231 for a first local interconnection structure 710, used as the word line W/L connecting the gates of the pass transistors PS together as illustrated in FIG. 7. The second through hole 503 may expose the semiconductor substrate 100 disposed near the second gate 235 to connect to a metal interconnection. Since the first through hole 501 may be aligned over the first gate 231 to expose the first silicide layer 401 and the second through hole 503 should expose the surface of the semiconductor substrate 100 disposed near the second gate 235, the first through hole 501 may need to have a depth different from that of the second through hole 503. Therefore, even after the first through hole 501 having a relatively shallow depth is formed, the etch process may need to be performed subsequently for opening the second through hole 503 to the surface of the semiconductor substrate 100.

At this time, the etch stop layer 500 exposed by the first through hole 501 has to perform an etch stop function during the etching process for the completion of the second through hole 503, but the etch stop layer 500 may be partially removed so that the first spacer 301 at a side of the first silicide layer 401 may be exposed. A portion of the first layer 311 of the silicon oxide layer constituting the first spacer 301 may be removed due to this etch process. In addition, after completing the etch process of forming the first and second through holes 501 and 503 by the exposure of the etch stop layer 500, the portion of the first layer 311 may also be partially removed during a process of removing the exposed etch stop layer 500.

Nevertheless, in this embodiment, the first spacer 301 under the first through hole 501 is a normal spacer (i.e. a non-recessed spacer) having an upper portion that extends relatively high. Accordingly, the first layer 311 of the first spacer 301 keeps the vertical thickness of the first spacer equal to that of the first gate 231, which may be about 1,500 Å or more, for example.

Figure 1:
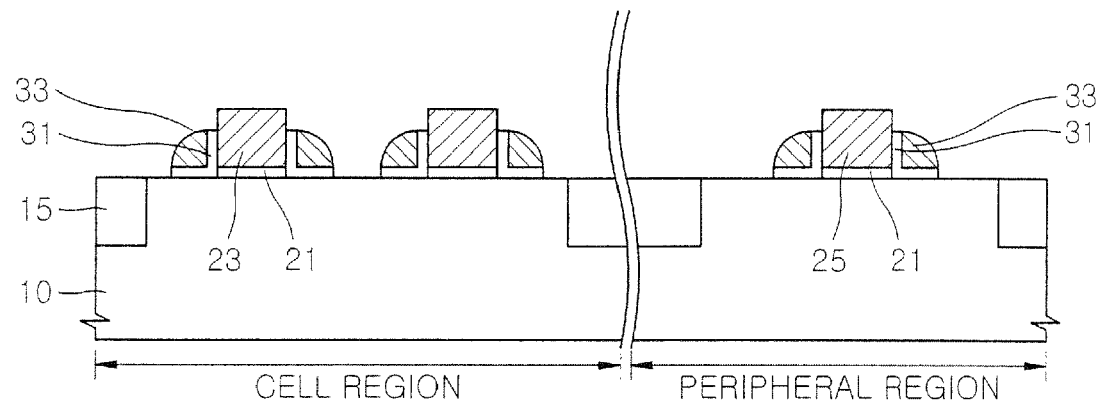
FIGS. 1 through 5 are schematic cross-sectional views illustrating a method of improving the gate resistance of a conventional semiconductor device.
Figure 2:
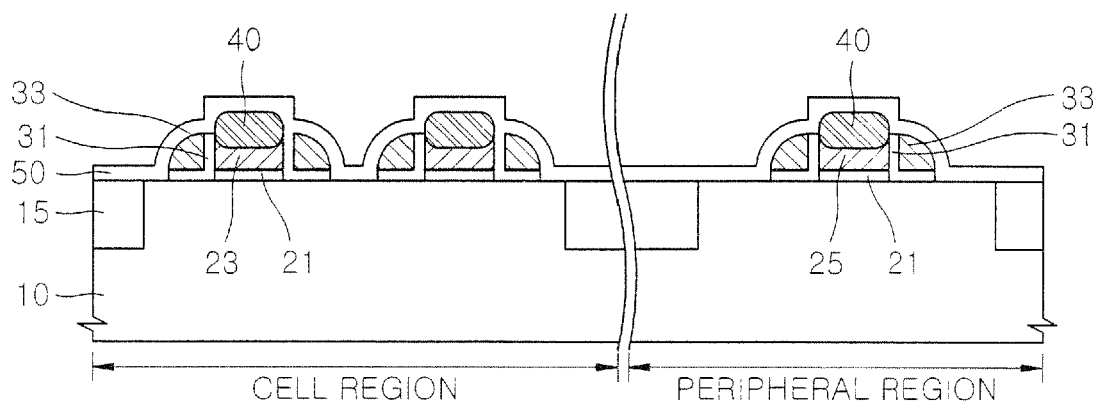
Figure 3:
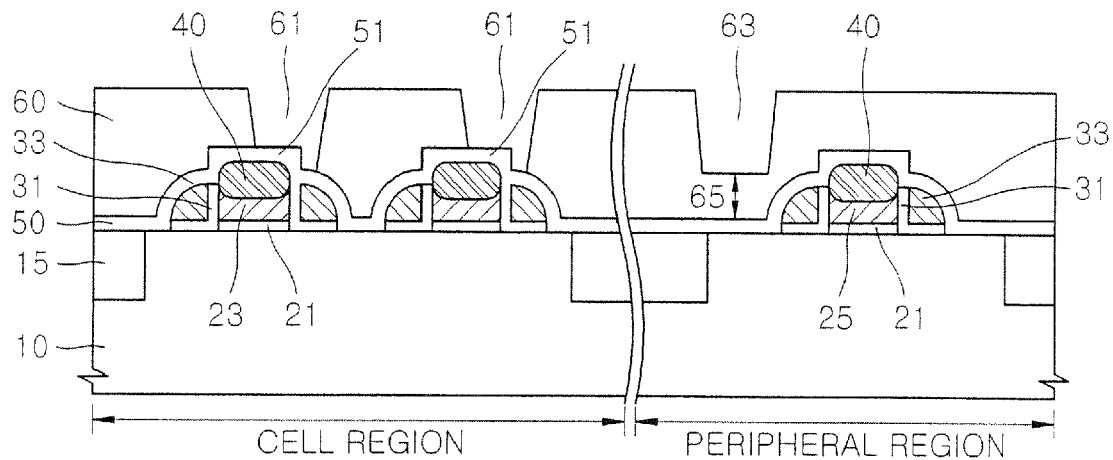
Figure 4:
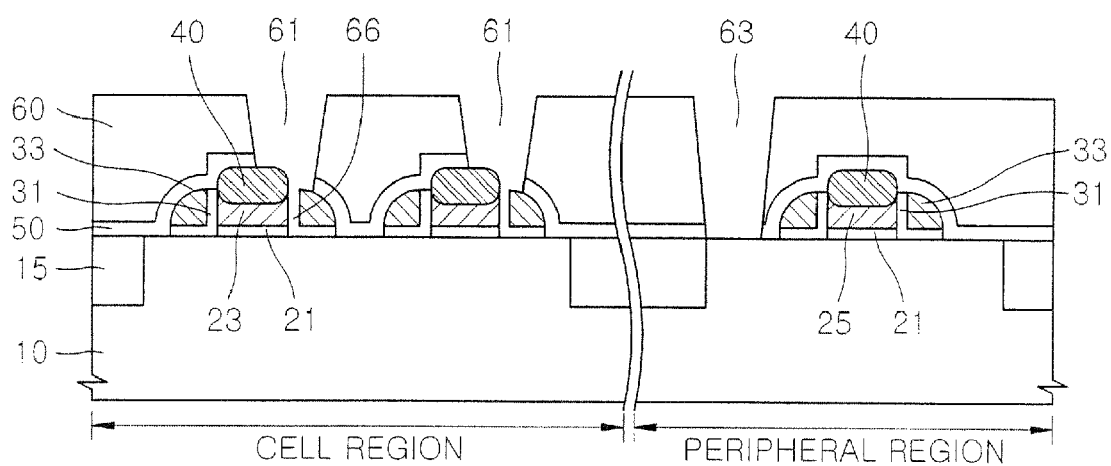
Figure 5:
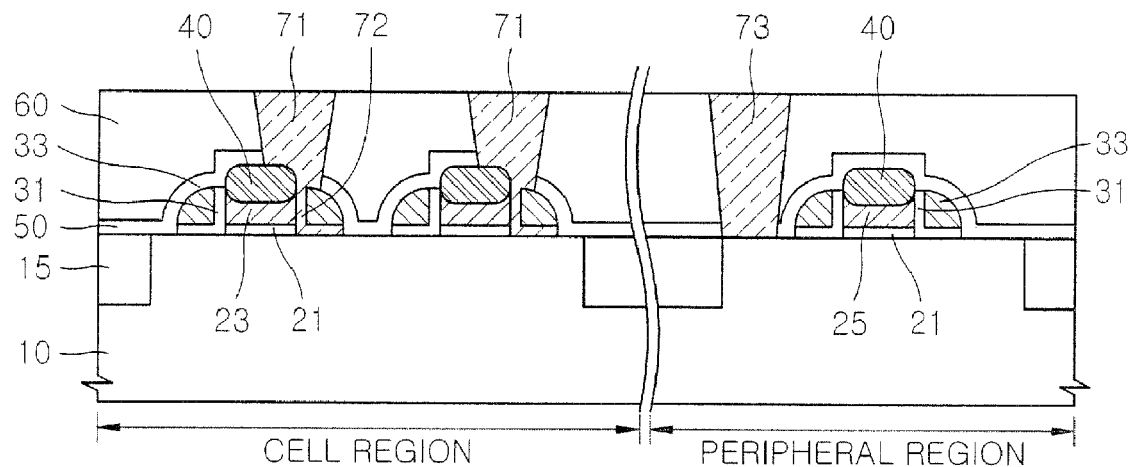

Therefore, although the first layer 311 is partially removed during the etching process and/or a following process of removing the etch stop layer 500, the first layer 311 still remains at a sufficient thickness. Thus, it is possible to effectively prevent downward extension of the first through holes 501 as illustrated in FIGS. 4 and 5, so that the surface of the semiconductor substrate 100 cannot be exposed to the outside.

Figure 14:
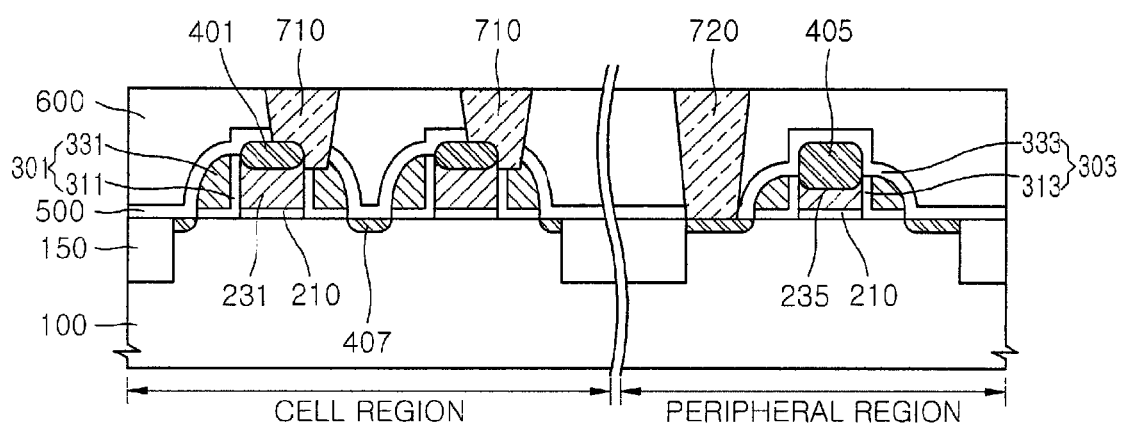

Referring to FIG. 14, a first interconnection structure 710 may be formed to fill the first through holes 501 in the cell region, and a second interconnection structure 720 may be formed as an interconnection contact within hole 503 in the peripheral region. Specifically, after cleaning the first and second through holes 501 and 503, a conductive layer (e.g., tungsten) may be formed to fill the first and second through holes 501 and 503 and then planarized using a chemical mechanical polishing (CMP) process. The conductive layer may include a barrier metal (BM) layer at a lower portion thereof. Consequently, the first interconnection structure 710 electrically connected to the first gate 231, and the second interconnection structure 720 electrically connected to the semiconductor substrate 100, can be formed.

The first interconnection structure 710 can be used as the local interconnection connecting the gates of the PS transistors together, as illustrated in FIG. 7. The second interconnection structure 720 can be used as the interconnection contact connecting the semiconductor substrate 100 to an upper interconnection in the peripheral region.

FIGS. 15 through 23 are cross-sectional views illustrating a semiconductor device with improved gate resistance and a method of manufacturing the same according to another embodiment.

According to the current embodiment, an example of an L-shaped spacer structure is provided for the gate spacer structure. The L-shaped spacer may prevent electrostatic generation in the transistors. That is, the L-shaped spacer may be used for constructing an ESD (ElectroStatic Discharging) region at the junction of the transistors.

In addition, according to the current embodiment, an example of a device such as an ESD protection transistor using a silicide blocking layer (SBL) provided in an SBL region in a peripheral region is illustrated.

Figure 15:
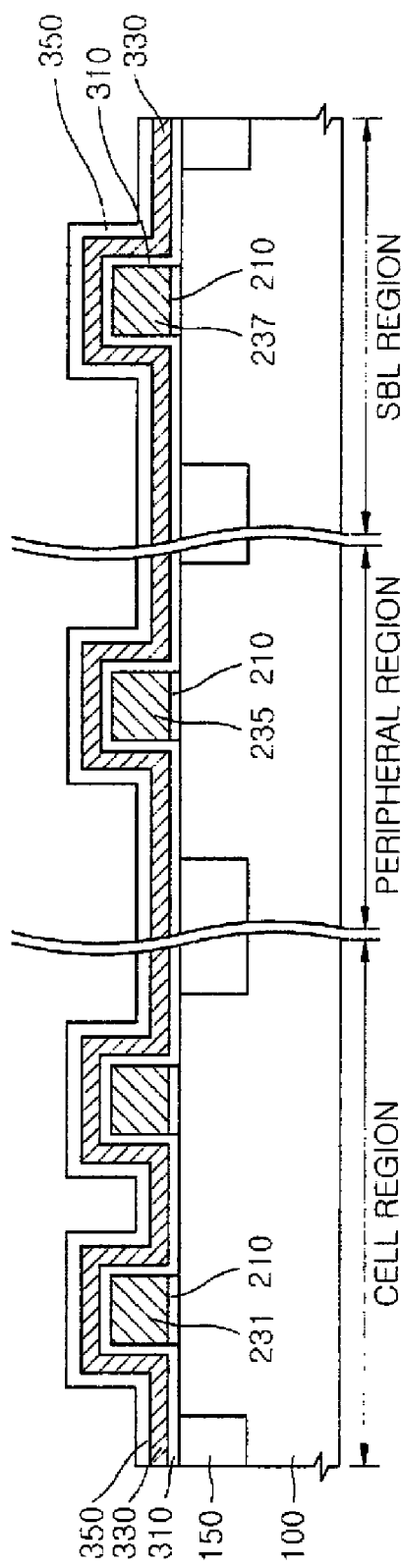

Referring to FIG. 15, first, second, and third gates 231, 235, and 237, each having a gate insulating layer 210, are formed over a semiconductor substrate 100 having a cell region, a peripheral region, and an SBL region, like in FIG. 8. An ion implantation process for forming an LDD structure may be then performed.

Then, a spacer process may be performed to form an L-shaped spacer on sidewalls of the first, second, and third gates 231, 235, and 237. For example, an insulating layer having at least three layers with different etching selectivities may be formed and anisotropically etched to form the spacers.

For this purpose, a first layer 310, a second layer 330, and a third layer 350 may be sequentially formed to cover the first, second, and third gates 231, 235, and 237. The first layer 310 may be formed by depositing silicon oxide to a thickness of about 10 Å to 200 Å. The second layer 330 may be thicker than the first layer 310. For instance, the second layer 330 may be formed by depositing silicon nitride to a thickness of about 100 Å to 500 Å. The third layer 350 may be formed by depositing silicon oxide to about 100 Å to 500 Å.

Figure 16:
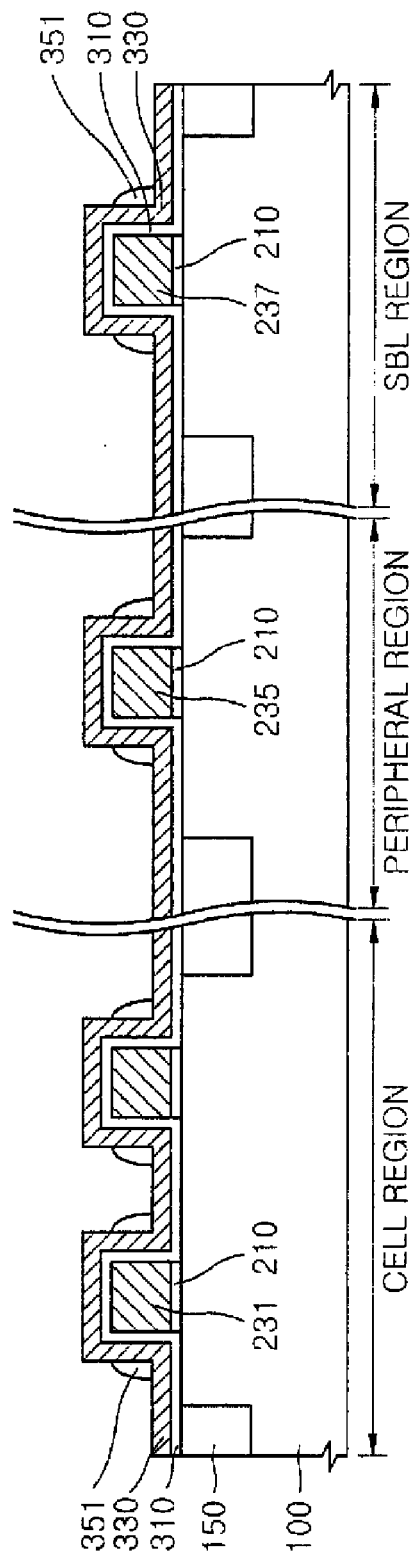

Referring to FIG. 16, a spacer first etch (i.e., an anisotropic etch process) may be performed on the third layer 350 until the second layer 330 is exposed, thereby forming a spacer first pattern 351. At this time, the second layer 330 acts as an etch stop layer.

Referring to FIG. 17, a second etch mask 850 may be formed to cover the cell region and expose the peripheral region and/or the SBL region. First through holes aligned over the first gates 231 are formed in the cell region, and second through holes aligned over the substrate 100 near the second gate 235 are formed the peripheral region. Also, the third gate 237 is formed the SBL region.

Then, a spacer second etch process is selectively performed on the peripheral region and/or the SBL region exposed by the etch mask 850. In the spacer second etch process, the second layer 330 may be selectively etched using the spacer first pattern 351 as an etch mask and using the first layer 310 as an etch stop layer. Consequently, the spacer second pattern 335 is formed as the L-shaped second layer pattern, and the surface of the first layer 310 is exposed near the spacer second pattern 335.

At this time, a first exposed portion 315 of the first layer 310 and a second exposed portion 316 of the second and third gates 235 and 237 may remain at a predetermined thickness. For example, the first and second exposed portions 315 and 316 may remain at a thickness of about 90 Å, which may be slightly decreased from this layer's original thickness.

Referring to FIG. 18, the second etch mask 850 is selectively removed.

Referring to FIG. 19, a spacer third etch process is performed to entirely etch the second layer 330 remaining in the cell region, and the spacer second pattern 335 of the peripheral region and the SBL region. The spacer third etch process substantially comprises etching the second layer 330 and can be performed with an etching selectivity with respect to the spacer first pattern 351 and the first layer 310.

Consequently, the spacer second pattern 335 that is a normal L-shaped pattern is formed on the sidewalls of the first gate 231. Also, third pattern 336 that is the recessed L-shaped pattern having a relatively low height may be formed on the sidewalls of the second and third gates 235 and 237. That is, the first spacer 305 with a normal spacer shape (i.e. a non-recessed spacer shape) is formed in the cell region, and second and third spacers 307 and 309 with the recessed L-shaped pattern are formed in the peripheral region and the SBL region, respectively.

Although this etching process is a selective etching process performed on the second layer 330 formed of silicon nitride, a portion of the exposed first layer 310 may be partially removed. Thus, top surfaces of the second and third gates 235 and 237 in the peripheral region and the SBL region may be exposed. In the region near the second and third gates 235 and 237, the thickness of the residual portion 315 of the first layer 310 may be further decreased, but remain tip to a thickness of, say, about 30 Å.

Referring to FIG. 20, an SBL 900 may be formed to cover the third gate 237 of the SBL region and the semiconductor substrate 100. The SBL 900 may be formed by depositing silicon oxide to about 100 Å and silicon nitride to 100 Å, for example. After forming the multi-stacked structure, the photolithography or the selective etching process may be performed so that the SBL 900 remains only over the SBL region.

Therefore, the SBL 900 is directly formed over the third spacer 309 and the third gate 237 in the SBL region and thus is protected from a subsequent silicidation reaction.

Referring to FIG. 21, a spacer fourth etch process may be performed to selectively remove the exposed spacer first pattern 351 and the exposed portion of the first layer 310. Thus, the normal L-shaped spacer 305 is formed on the sidewalls of the first gate 231. That is, the L-shaped first spacer 305 includes the first pattern 310 and the spacer third pattern 351 whose height is equal to the height of the first gate 231.

The L-shaped second spacer 307 is formed on the sidewalls of the second gate 235. The L-shaped second spacer 307 may include the recessed spacer second pattern 336 having a relatively low height and the recessed first pattern 310 under the recessed spacer second pattern 336.

The third spacer 309 is maintained on the sidewalls of the third gate 237, and may include the first pattern 351 whose height is equal to the third gate 237, and the recessed spacer second pattern 336.

Therefore, three different kinds of spacer structures can be provided in each region over the semiconductor substrate 100. Then, an ion implantation process may be performed to form source/drain regions in the semiconductor substrate 100 near the spacers 305, 307, and 309.

Referring to FIG. 22, a first silicide layer 401 and a second silicide layer 405 may be formed on the exposed first gate 231 and the exposed second gate 235.

For example, an oxide cleaning process may be performed on the resulting structure. At this time, any residual portion of the first layer 310 on the semiconductor substrate 100 may be removed. Then, a metal layer such as a cobalt layer may be deposited on the cleaned resultant, and a silicidation process is performed using a first thermal treatment process at about 400 degrees. Next, the cobalt layer that does not participate in the silicidation reaction may be selectively removed by a chemical wet strip, etc.

Consequently, the first and second silicide layers 401 and 405 of the cobalt silicide are formed on the surfaces of the first and the second gates 231 and 235, respectively. Also, a third silicide layer 407 may be formed on the surface of the exposed semiconductor substrate 100, which may be used for source/drain electrodes. At this time, the second silicide layer 405 has a relatively wider contact surface area and is relatively thicker than the first silicide layer 401. Such a second silicide layer 405 is formed on the second gate 235 having a relatively wide contact surface with the cobalt layer. The reason for this is that the silicidation reaction depends on the contact surface between the silicon and the metal.

Referring to FIG. 22, an etch stop layer 500 covering the first, second, and third silicide layers 401, 405, and 407 may be formed. The etch stop layer 500 may include a silicon oxynitride (SiON) layer with a thickness of tens of angstroms, preferably 60 Å.

Figure 23:
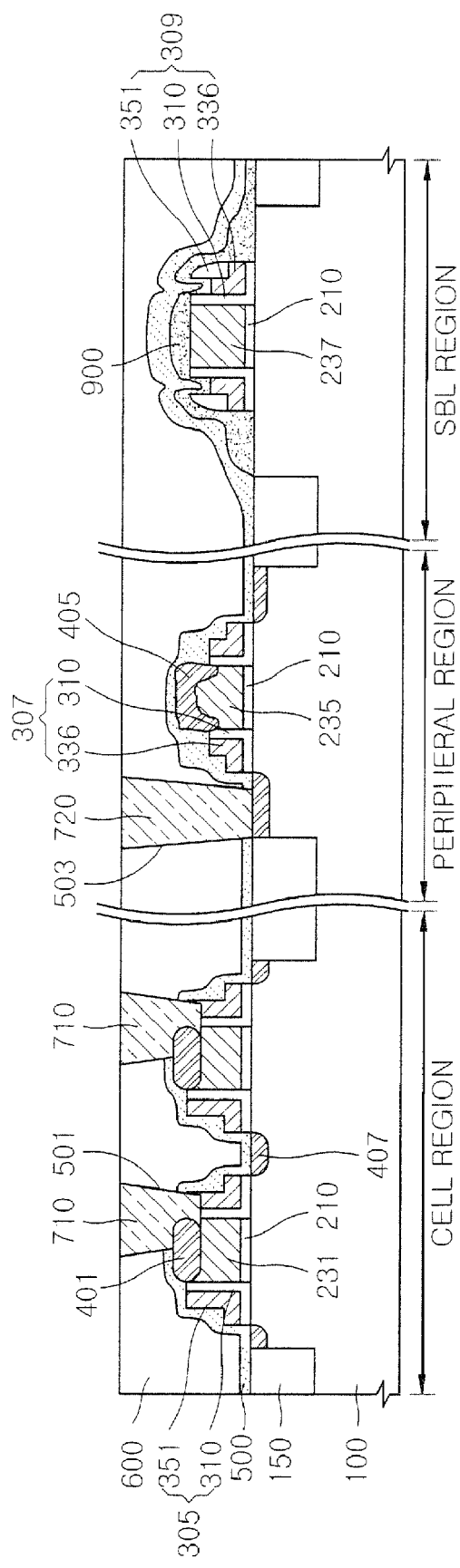

As described earlier in FIG. 13, and shown in FIG. 23, an insulating layer 600, such as a silicon oxide layer, may be formed on the etch stop layer 500. Then, the insulating layer 600 is selectively etched using a photolithography and etching process to form first and second through holes 501 and 503 in the insulating layer 600.

As described earlier in FIG. 14, and shown in FIG. 23, a first interconnection structure 710 and a second interconnection structure 720 are formed. The first interconnection structure 710 can be used as a local interconnection filling the first and second through holes 501 and 503, and the second interconnection structure 720 can be used as an interconnection contact.

According to some embodiments, since a normal spacer structure (i.e. non-recessed spacer structure) is provided in a cell region and a recessed spacer structure is provided in the peripheral region, respectively, it is possible to prevent a spacer on sidewalls of a gate from being over-etched during an etch process for forming a first interconnection structure for a local interconnection over the gate in the cell region. Therefore, it is also possible to prevent bridge defects due to over-etching, which occurs because the barrier metal layer for a subsequent interconnection contact is accidentally connected to the underlying substrate.

At the same time, since the recessed spacer structure is provided in the peripheral region, it is possible to remarkably enhance a resistance distribution of the cobalt silicide layer occurring in a gate line width of 100 nm or less.

While the present invention has been particularly shown and described with reference to exemplary embodiments thereof it will be understood by those of ordinary skill in the art that various changes in form and details may be made therein without departing from the spirit and scope of the present invention as defined by the following claims.

What is claimed is:

1. A method of manufacturing a semiconductor device, comprising:
    forming a first gate and a second gate in a first region and a second region of a semiconductor substrate, respectively;
    sequentially forming first, second, and third layers of a first, second, and third insulating material, respectively, to cover the first gate and the second gate;
    anisotropically etching the third layer using the second layer as an etch stop to form a spacer first pattern of the third layer;
    selectively exposing and anisotropically etching a portion of the second layer over the second region to form a spacer second pattern of the second layer on a side portion of the second gate;
    etching another portion of the second layer to form a spacer third pattern of the second layer over the first region while forming a recessed spacer second pattern by recessing the spacer second pattern; and
    forming a first spacer and a second spacer by selectively etching the spacer first pattern and an exposed portion of the first layer, wherein the first spacer comprises a portion of the first layer and the spacer third pattern similar in height to the first gate, and the second spacer comprises a portion of the first layer recessed to expose a side surface of an upper portion of the second gate and the recessed spacer second pattern, the second spacer being lower than the first spacer.

2. The method of claim 1, further comprising:
    forming a first silicide layer on an exposed upper surface of the first gate, and a second silicide layer on an exposed upper surface and side surface of the second gate;
    forming an insulating layer covering the first and the second silicide layers;
    forming a first through hole that penetrates the insulating layer and is aligned over the first gate, and a second through hole to expose a surface of the semiconductor substrate adjacent to the second gate; and
    filling the first and second through holes with a conductive material to form first and second interconnection structures, respectively.

3. The method of claim 1, wherein the first gate is a transistor gate in a cell region that is the first region of the semiconductor substrate, and the second gate is a transistor gate in a peripheral region that is the second region of the semiconductor substrate.

4. The method of claim 2, wherein the first gate is a transistor gate of a static random access memory (SRAM) device in a cell region that is the first region.

5. The method of claim 4, wherein the first interconnection structure is a local interconnection structure for connecting gates of adjacent transistors together, the adjacent transistors constructing the SRAM device.

6. The method of claim 1, wherein the first layer comprises a silicon oxide layer having a thickness of about 10 Å to 200 Å, the second layer comprises a silicon nitride layer having a thickness of about 100 Å to 500 Å, and the third layer comprises a silicon oxide layer having a thickness of about 100 Å to 500 Å.

7. The method of claim 1, wherein the first spacer has an L-shape structure whose height is substantially equal to that of the first gate, and the second spacer has an L-shape structure whose height is less than that of the first spacer by about 100 Å to 500 Å.

8. The method of claim 1, wherein forming the spacer third pattern and the recessed spacer second pattern is performed so that a portion of the first layer remains over the first gate and an upper surface of the second gate is exposed.

9. The method of claim 2, further comprising:
   forming a third gate over a third region of the semiconductor substrate together with the first gate;
   forming a third spacer on sidewalls of the third gate, the third spacer comprising a spacer fourth pattern formed together with the spacer first pattern, a recessed spacer fifth pattern formed together with the recessed spacer second pattern, wherein a portion of the first layer remains on the sidewalls of the third gate, and an upper surface of the third gate is exposed at the same time as the upper surface of the second gate is exposed; and
   forming a silicide blocking layer (SBL) covering the third region before forming the first and second silicide layers to protect an underlying structure from a silicidation reaction.

10. The method of claim 2, wherein the second silicide layer is thicker than the first silicide layer by the thickness of the second spacer.

11. The method of claim 2, wherein each of the first and second silicide layers comprises a cobalt silicide layer.

12. The method of claim 2, further comprising, before forming the insulating layer, forming an etch stop layer to form the first and second through holes, wherein the etch stop layer comprises a silicon oxynitride layer.

* * * * *